United States Patent [19]

Benecke et al.

[11] 4,390,941
[45] Jun. 28, 1983

[54] STATIC MAGNETIC FREQUENCY MULTIPLIES

[75] Inventors: Wilhelm Benecke, Bad Neustadt, Fed. Rep. of Germany; Heinz Rosenberg, Vienna, Austria

[73] Assignee: Siemens Aktiengesellschaft, Berlin & Munich, Fed. Rep. of Germany

[21] Appl. No.: 127,575

[22] Filed: Mar. 6, 1980

[30] Foreign Application Priority Data

Apr. 4, 1979 [DE] Fed. Rep. of Germany ....... 2913612

[51] Int. Cl.³ .......................................... H02M 5/32
[52] U.S. Cl. ..................... 363/174; 310/66; 310/160; 336/155
[58] Field of Search .............. 310/160, 161, 169, 170, 310/129, 216, 66, 256, 112; 307/220 R; 363/174, 175, 176, 170, 171, 172; 336/120, 135, 155

[56] References Cited

U.S. PATENT DOCUMENTS

| | | | |
|---|---|---|---|
| 3,177,387 | 4/1965 | Leischner | 363/176 |
| 3,197,660 | 7/1965 | Leischner | 363/176 |
| 3,445,701 | 5/1969 | Shapiro | 363/175 |
| 3,777,296 | 12/1973 | Ohyama | 336/135 |
| 3,930,175 | 2/1975 | Chirgwin | 310/160 |
| 4,039,910 | 8/1977 | Chirgwin | 363/176 |
| 4,160,925 | 7/1979 | Ishikawa | 310/160 |

FOREIGN PATENT DOCUMENTS

| | | | |
|---|---|---|---|
| 589252 | 12/1959 | Canada | 310/161 |
| 508908 | 10/1930 | Fed. Rep. of Germany | 310/160 |
| 524360 | 4/1931 | Fed. Rep. of Germany | 310/160 |
| 1035261 | 7/1958 | Fed. Rep. of Germany | 310/160 |
| 630289 | 10/1949 | United Kingdom | 310/160 |

OTHER PUBLICATIONS

ETZ-A, 1962, pp. 523-527; "Statische Frequenzumformung von 50 Hz Drehstorm Auf 150 Hz Drehstrom"; P. Mertens; Aachen, Germany.

*Primary Examiner*—R. Skudy
*Attorney, Agent, or Firm*—Kenyon & Kenyon

[57] ABSTRACT

A static magnetic frequency multiplier has iron structures which form a closed magnetic circuit and which carry a polyphase primary winding having $p_1$ pole pairs distributed in slots. The winding legs, pitch, interleaving of circuits, setting of the slots, and the like, of the primary winding are so constructed that a voltage is induced at its terminals only by the fundamental of a field which has the pole pair number $p_1$. In addition, the iron structures carry a secondary winding with the pole pair number $p_2$ which is an uneven multiple of $p_1$ and which is distributed in slots, being magnetically coupled to the primary winding. The secondary winding is designed so that no voltage is induced at its terminals by the fundamental of a field having the pole pair number $p_1$. The iron structures are designed so that either the layer containing the slot teeth or the magnetic return path is subjected, at least in part, to a pronounced magnetic saturation by the magnetic field produced by the primary winding when it is supplied with the nominal primary voltage at the nominal frequency.

10 Claims, 16 Drawing Figures

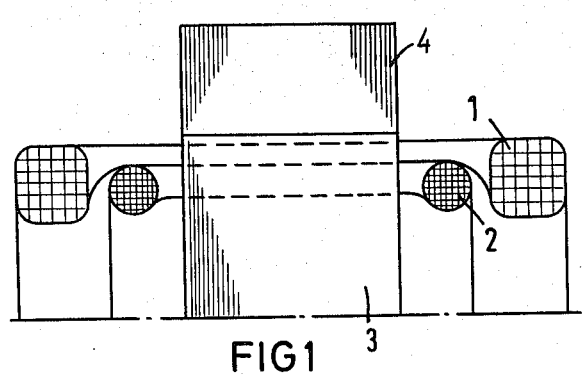
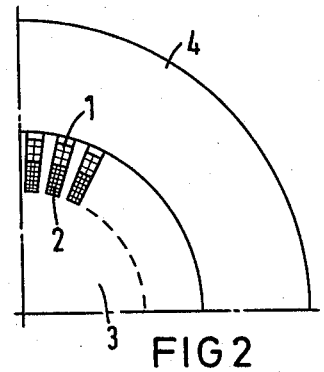
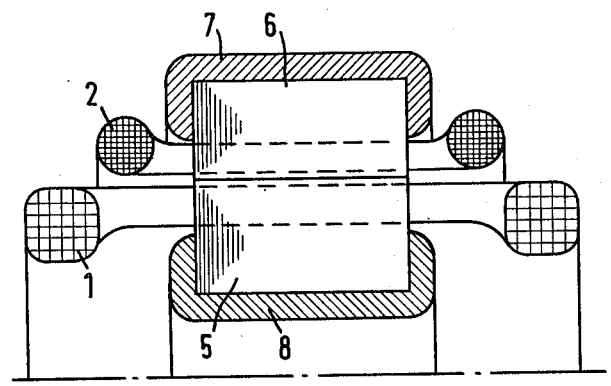
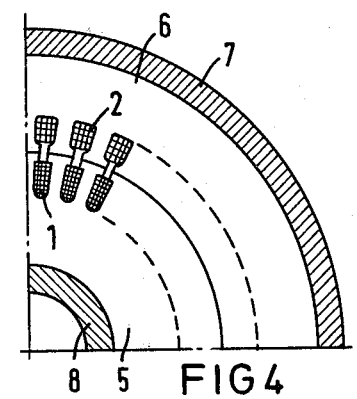
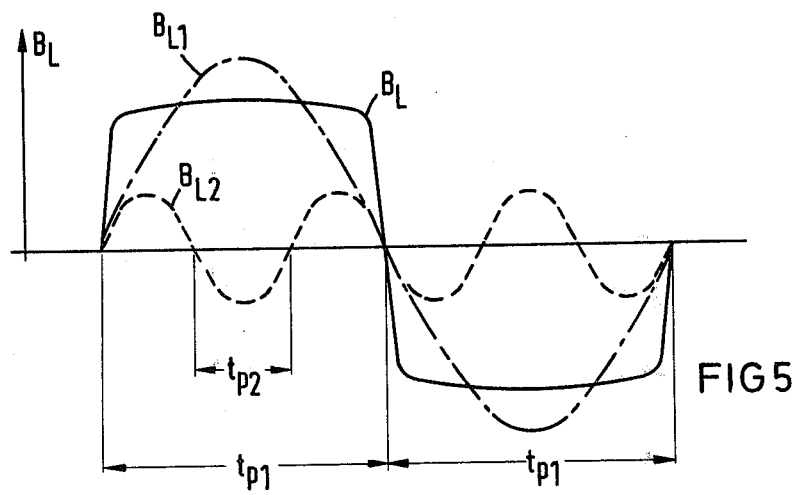

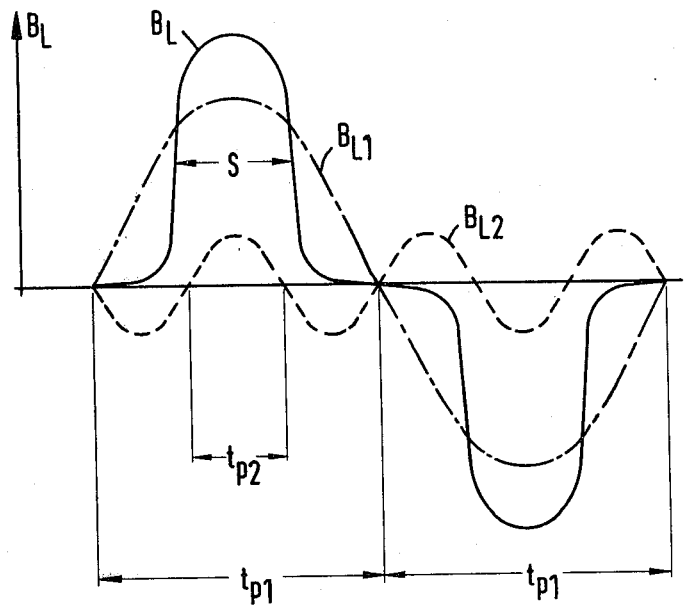
FIG 6
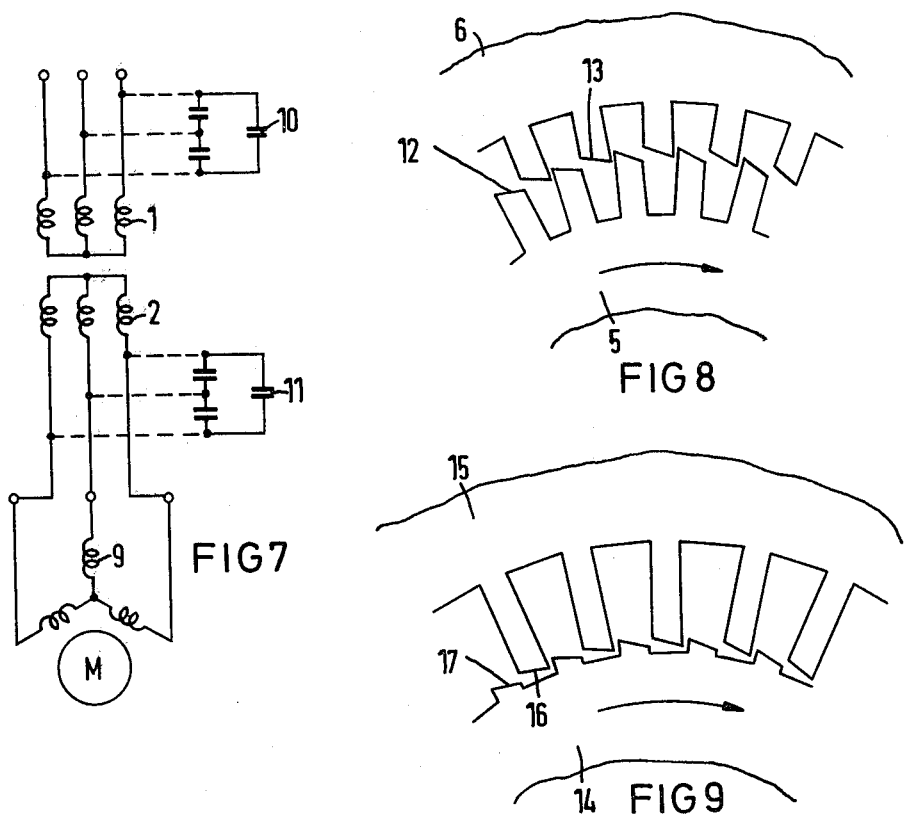
FIG 7
FIG 8
FIG 9

STATIC MAGNETIC FREQUENCY MULTIPLIES

BACKGROUND OF THE INVENTION

This invention relates to improved static magnetic frequency multipliers.

The principle of frequency multiplication of polyphase AC voltages by means of magnetically saturated transformers is known (ETZ-A, 1962, pages 523 to 527). However, circuits used heretofore have required a number of separate single phase transformers. This results in considerable cost, requires much space, and results in great weight. In addition, the efficiencies are often low and undesirable harmonics occur in the primary current and the secondary voltage.

It is an object of the invention to avoid the mentioned disadvantages while making full use of the advantages of frequency multiplication by magnetic saturation, namely, elimination of moving parts and elimination of mechanical wear, as well as the provision of long service life and high reliability.

SUMMARY OF THE INVENTION

A frequency multiplier according to the teachings of the invention has a laminated iron structure which forms a closed magnetic circuit and a polyphase primary winding having the pole pair number $p_1$, distributed in slots. The winding is designed using known techniques in such a way that a voltage will be induced at its terminals substantially only by the fundamental of a field having the number of pole pairs $p_1$. The structure also has a secondary winding with the pole pair number $p_2$ which is distributed in the same way as the primary winding and is magnetically coupled to the primary winding and in which $p_2$ is an uneven multiple of $p_1$. The secondary winding is designed so that no voltage can be induced at its terminals by the fundamental of a field having the pole pair number $p_1$. Further, the iron structure is designed so that at least one layer of tooth slots or a part of the magnetic return path (yoke) is subjected to a pronounced magnetic saturation by the magnetic field generated by the primary winding when it is fed with the nominal primary voltage at the nominal frequency.

BRIEF DESCRIPTION OF THE DRAWINGS

FIGS. 1 and 2 are front and side views of an embodiment of the invention in partial cross-section;

FIGS. 3 and 4 are front and side views in partial cross-section of a second embodiment of the invention;

FIGS. 5 and 6 show spatial flux density distributions which are obtainable by magnetic saturation of rotating or travelling fields and which form the basis for the invention, as well as the resolution of those distributions in harmonics;

FIG. 7 shows an example of a frequency multiplier in a circuit which includes a motor;

FIGS. 8 and 9 are views of two embodiments of the iron structures on which, according to the invention, the windings are put;

DETAILED DESCRIPTION OF THE INVENTION

Figure 10:
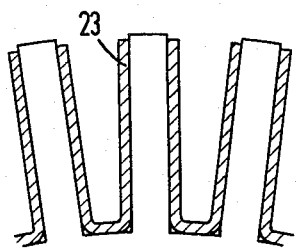
FIGS. 10 and 11 are side views, in partial cross-section, of structures for attenuating undesirable parasitic magnetic fluxes.

The frequency multiplier illustrated in FIGS. 1 and 2 consists of a laminated iron structure in the form of a cylindrical stack of laminations 3 which carries the primary winding 1 of the multiplier and the secondary winding 2 of the multiplier in slots in its circumference. The magnetic return circuit for the rotating field excited by the primary winding is provided by another laminated iron structure in the form of a surrounding hollow cylindrical lamination stack 4, the inside surface of which is separated from the tops of the teeth of the first lamination stack only by a thin layer of insulation (not shown). According to the invention, the teeth are made narrow and with parallel flanks so that a pronounced magnetic saturation is obtained over their entire length. The yoke of cylindrical lamination stack 3 and the cross-section of the hollow cylindrical lamination stack 4, are, on the other hand, designed so that no saturation occurs there.

The polyphase primary winding 1 has $p_1$ pairs of poles (preferably $p_1=2$ or 4) and, according to the invention, is designed in a known way. The connection of the coils, the pitch, the interleaving of circuits, the gradation of the number of conductors per slot, and the setting of the slots are done in such a way that, practically, only the fundamental of a rotating field with the pole pair number $p_1$ can induce a voltage at its terminals (a so-called harmonic-free winding). Assuming sinusoidal waveform of the line voltage supplied to primary winding 1, such a winding carries only sinusoidal magnetizing currents, accompanied by high iron saturation, which generate a rotating field which has a sinusoidal spatial distribution.

As can be seen from FIG. 5, these ampere-turns generate, because of the tooth saturation, a pronounced trapezoidal (and in the limit, rectangular) distribution of the flux density $B_L$ of the rotating field occurring at the boundary surface between iron structures 3 and 4 over the pole pitch $t_{p1}$ ($B_L$ being average over a slot pitch). Such a rotating field contains, in addition to the fundamental having the flux density $B_{L1}$, pronounced higher harmonics of uneven order, of which the third harmonic with the flux density waveform $B_{L2}$ and the pole pitch $t_{p2}=t_{p1}/3$ is illustrated here as an example. This harmonic has three times the number of poles of the primary winding 1 ($p_2=3p_1$), but rotates with the same speed as the fundamental. It therefore induces a frequency which is triple the primary frequency in the single- or polyphase secondary winding 2 which, according to the invention, is provided with $p_2$ pole pairs. Secondary winding 2 is designed so that it cannot be excited by the fundamental of the pole pair number $p_1$ (with most commonly used windings, this is the case anyhow), but so that advantageously, also, the other harmonics of the saturated rotating fields (pole pair numbers $p=p_2$) cannot substantially influence its terminal voltage. This can be achieved by using the known measure mentioned in connection with the primary winding.

Also, according to the invention, harmonics of the rotating field other than those shown in FIG. 5, for instance the fifth or the seventh, can be used for frequency multiplication according to their order.

In the frequency multiplier of FIGS. 3 and 4, primary winding 1 is contained in slots on the outer circumference of a cylindrical lamination stack 5, and secondary winding 2 is placed in corresponding slots on the inside circumference of a hollow cylindrical lamination stack 6. This design is advantageous for the manufacture of the windings, serves well at high voltages, and improves dissipation of heat. Here, too, the gaps between the tops of the teeth of the two lamination stacks are closed, except for a thin layer of insulation (not shown). In this illustrative embodiment, the teeth are kept unsaturated and the magnetic saturation is placed in the yoke of at least one of lamination stacks 5 or 6 (in the embodiment of FIGS. 3 and 4 it is both). In order to prevent the escape of saturation-reducing, i.e. parasitic stray fluxes, solid attenuation members 7 and 8 are connected to and substantially enclose the saturated yokes. According to the invention these members consist of a non-magnetic material having a high electric conductivity, especially a light metal.

FIG. 6 shows the pronounced non-sinusoidal distribution of the flux density $B_L$ of the rotating field which is produced when the yoke is saturated and the teeth are not. As comparison of FIGS. 5 and 6 shows, saturation of the teeth or the yoke has the opposite effect with respect to distortion of the form of the rotating field, and resulting in phase shift of the harmonics. Therefore, according to the invention, only tooth saturation or yoke saturation must be provided. The embodiment having yoke saturation has the advantage that the width S between the steep flanks of the rotating field (FIG. 6) can be varied in proportion to the pole pitch $t_{p1}$ of the primary winding 1, and the proportion of the harmonic of a desired order can thereby be optimized.

In the motor circuit of FIG. 7, primary winding 1 of the harmonic generator is shown as star-connected. With this preferred embodiment, voltage harmonics, the order of which is divisible by three, can be induced in the winding legs without appearing at the terminals. Also, the star connection facilitates the layout of the secondary winding 2. The stator winding 9 of the connected motor can have any type of connection. In order to relieve the supply network of reactive magnetizing power which otherwise must be supplied to the primary winding 1, capacitors 10 can, according to the invention, be shunted across the stator winding. Also, by connecting additional capacitors 11 to secondary winding 2, the latter is relieved of the reactive motor current, on the one hand reducing the winding losses and, on the other hand, causing a stiffening of the voltage.

Any air gap between the tops of the teeth of the cylindrical lamination stack 3 and the hollow cylindrical lamination stack 4 (FIGS. 1 and 2) or between the tops of the teeth of the lamination stacks 5 and 6 (FIGS. 3 and 4) is detrimental because it increases the amount of reactive power required by the frequency multiplier without having a useful effect. On the other hand, metallic contact between the surfaces in question is generally not permissible, since it could form a conducting bridge between adjacent laminations and thereby, large additional eddy current losses. A thin layer of insulation of varnish or film (not shown in the drawings) must therefore be provided between the laminations at the transition. When these surfaces are cylindrical, clearance (play) must also be provided between them so as not to damage the insulating layer when lamination stacks 3 and 4 or 5 and 6 are assembled. This disadvantage is avoided by designing the tops of the teeth as shown in FIGS. 8 and 9, and assembly is considerably facilitated.

According to the invention as shown in FIG. 8, the opposing surfaces of the tops of the teeth 12 and 13 are sloped so that, after wound lamination stacks 5 and 6, for example, have been fitted one into another (which can be done conveniently where they are in the relative position shown), the teeth are centered by rotating one of the stacks relative to the other (in the direction of the arrow), closing the gaps between the tooth top surfaces 12 and 13, except for the thin insulating layer (not shown). Damage to this insulating layer is thus avoided.

FIG. 9 shows the design of tooth profiles used, according to the invention, when only one lamination stack 15 has a winding. Here, its tooth top surfaces 16 are sloped as in FIG. 8 and the lamination stack 14, which has no winding and, therefore, no slots, is given a sawtooth-like contour; the top surfaces 17 of its short teeth are given the same slope as is given to tooth top surfaces 16.

The design of the tooth tops shown in FIG. 8 or 9 is also applicable when the tooth heads are widened (undercut), to provide semi-closed slots.

In order to attenuate magnetic flux which reduces saturation of the teeth or the yoke, the attenuator inserts 23 of FIG. 10, which are insulated from the teeth, are provided. Inserts 23 are made of a light nonmagnetic material of high electric conductivity, preferably copper or aluminum; the insulation may be varnish or film, as described above.

Figure 11:
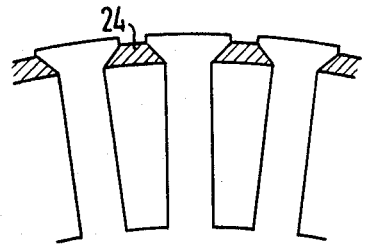
Figure 12:
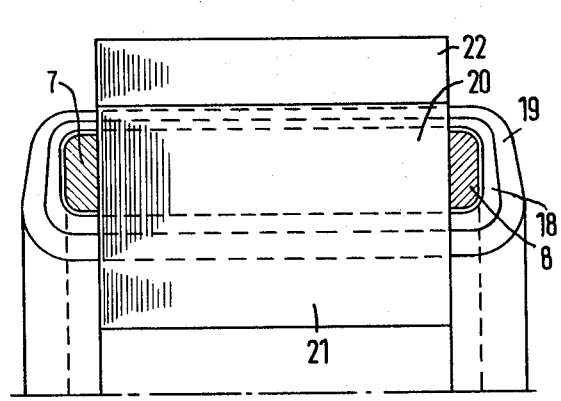
FIG. 12 shows an embodiment of the invention having a ring winding.

The saturation of an unslotted lamination stack, such as lamination stack 4 in FIG. 1, can be reduced by parasitic magnetic fluxes crosswise through the slot and the tooth head. In order to attenuate such fluxes, metallic slot closing wedges 24, insulated from the teeth, are provided according to the invention as shown in FIG. 11. An embodiment of the invention in which a substantial overhang of the coil head of a low-pole primary winding is avoided and at the same, good utilization is achieved, is shown in FIG. 12. There, a primary winding 18 and a secondary winding 19, designed as ring windings, are arranged on an annular lamination stack 20 which has an equal number of slots around its outside and inside peripheries. Solid attenuator elements 7 and 8, placed on the end faces of lamination stack 20 and preferably made of light metal, are provided for attenuating stray fluxes. Here two rotating fields are produced which are combined in the yoke of lamination stack 20 and find their respective return paths in an inner lamination stack 21 disposed in the aperture of annular lamination stack 20 or in an outer lamination stack 22 surrounding the lamination stack 20.

Figure 13:
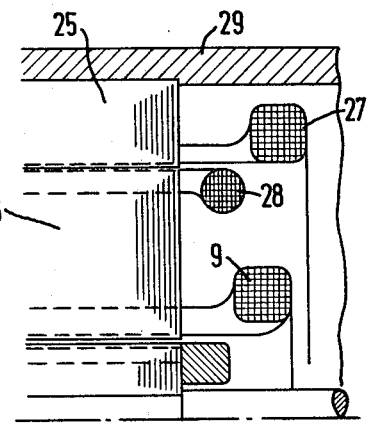
FIG. 13 is a view, in partial cross-section, of the invention as applied to an asynchronous motor.

FIG. 13 shows a way by which the frequency multiplier of the invention may be combined with an asynchronous motor which it feeds. The lamination stacks 25 and 26 which carry the respective primary and secondary windings 27 and 28 of the frequency multiplier are contained in the housing 29 of the motor in a manner, for instance, such as was shown in FIGS. 3 and 4. The stator winding 9 of the motor is arranged in other slots of hollow cylindrical lamination stack 26, e.g. slots facing the axis, and is electrically connected to secondary winding 28.

Figure 14:
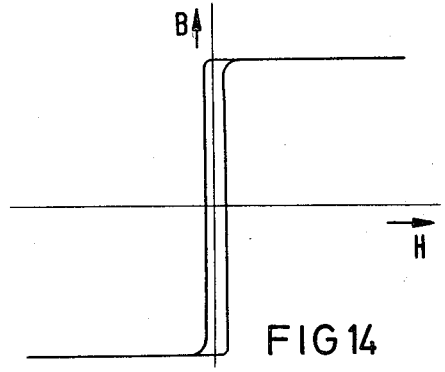
FIG. 14 illustrates the rectangular hysteresis loop of materials which, because of the shape of the loop, are particularly well suited for use in the invention.

In an advantageous variant of the invention, the lamination stacks or at least the parts thereof which are to be saturated are made of a material having the rectangular hysteresis loop shown in FIG. 14. The laminations in the saturation zone are so placed that the preferred orientation associated with hysteresis loop is aligned, at least approximately, in the direction of the magnetic lines of force. Since such materials are completely saturated at very low field strengths, a very low reactive primary power is obtained for the frequency multiplier. This results in reduction in winding losses and reduction in size, as well as elimination of capacitors 10 (FIG. 7) connected to the primary side of the multiplier. Also, measures for attenuating saturation-reducing parasitic magnetic fluxes are no longer necessary.

Figure 15:
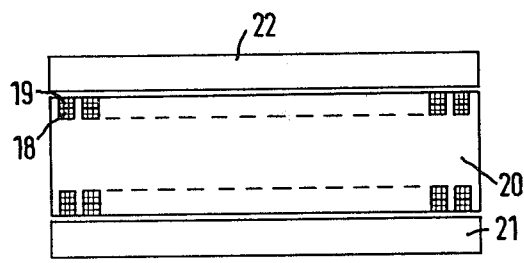
FIGS. 15 and 16 are side and end views, in partial cross-section, of an embodiment of the invention having a ring winding and which operates according to the travelling field principle.
Figure 16:
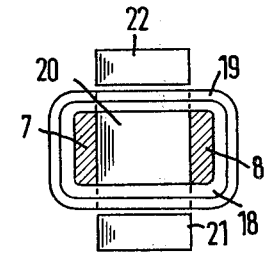

In the embodiments shown in FIGS. 1, 2, 3, 4, 12 and 13, all of which are characterized by cylindrical laminated iron structures, the iron structures must be built up from lamination segments which preferably overlap at the joints, as is customary in large electric machines, to make the use of laminations having the rectangular hysteresis loop possible. In this way the direction of the lines of force in the individual segments can be correlated at least, approximately, with the preferred magnetic orietation. A less expensive way of doing this is shown in the embodiment of the invention of FIGS. 15 and 16. Here the saturated field is a travelling field which is excited by the primary ring winding 18. Winding 18 is accommodated, together with the secondary ring winding 19, in slots on both sides of the lamination stack 20. Lamination stacks 21 and 22 are provided as magnetic return path parts and attenuators 7 and 8 suppress stray fluxes leaving the stack at the end faces. The structure shown in FIGS. 15 and 16 may be regarded as a segment of the structure of FIG. 12 which is straightened out and which extends over one or several pole pairs of the primary winding. The travelling field design of FIGS. 15 and 16 preferably has saturated teeth and is distinguished by compactness, by minimum waste of lamination stock, and by problem free maintenance of minimal gaps between the lamination stacks in production. If, in accordance with the invention, laminations with the rectangular hysteresis loop of FIG. 14 are used for stack 20, and the preferred orientation is placed along the axis of the teeth to be saturated, the described advantages of this material are obtainable without losses.

What is claimed is:

1. A static magnetic frequency multiplier comprising:
    laminated iron structures forming a closed magnetic circuit, at least one of the structures comprising slots between teeth;
    a polyphase primary winding, distributed in the slots and having a number of pole pairs $p_1$, the winding being such that a voltage will be induced at its terminals substantially only by the fundamental of a field having the pole pair $p_1$; and
    a secondary winding distributed in slots in one of the structures and magnetically coupled to the primary winding, the secondary winding having a number of pole pairs $p_2$, where $p_2$ is an uneven multiple of $p_1$, the second winding being such that no voltage can be induced at its terminals by the fundamental of a field having the pole pair number $p_1$;
    the iron structures having at least one magnetic return path at least a portion of which is subjected to pronounced magnetic saturation by the magnetic field produced by the primary winding when it is supplied with the nominal primary voltage at the nominal frequency while the teeth remain unsaturated.

2. A frequency multiplier in accordance with claim 1 further comprising:
    non-magnetic attenuator elements having high electric conductivity disposed adjacent to the magnetically saturated parts of the laminated iron structures for preventing escape of saturating flux.

3. A frequency multiplier in accordance with claim 2, further comprising the attenuator elements being disposed laterally along the saturated return path.

4. A frequency multiplier in accordance with claim 2, in which the attenuator elements comprise slot closing wedges in the slot openings and insulated from the teeth.

5. A frequency multiplier in accordance with claim 1 in which the laminated iron structures are cylindrical and hollow cylindrical, respectively, which fit inside one another concentrically and carry the primary and secondary windings of the multiplier, the laminated structures contained in the housing of a motor, the stator winding of the motor arranged in slots of the inner hollow cylindrical iron structure and connected to the secondary winding.

6. A frequency multiplier in accordance with claim 1 in which the magnetically saturated parts of the iron structures, at least in the saturated zone, comprise a material having a rectangular hysteresis loop so disposed that the preferred magnetic orientation associated with the loop is at least approximately aligned with the direction of the magnetic lines of force.

7. A frequency multiplier in accordance with claim 1 further comprising the laminated stacks being rectangular.

8. A static magnetic frequency multiplier comprising:
    laminated iron structures forming a closed magnetic circuit;
    a polyphase primary winding distributed in slots in two sides of one of the structures and having a number of pole pairs $p_1$, the winding being such that a voltage will be induced at its terminals substantially only by the fundamental of a field having the pole pair $p_1$;
    a secondary winding distributed in the slots and magnetically coupled to the primary winding, the secondary winding having a number of pole pairs $p_2$, where $p_2$ is an uneven multiple of $p_1$, the secondary winding being such that no voltage can be induced at its terminals by the fundamental of a field having the pole pair number $p_1$;
    the primary winding and the secondary winding being ring windings;
    the iron structures having at least one magnetic return path at least a portion of which is subjected to pronounced magnetic saturation by the magnetic field produced by the primary winding when it is supplied with the nominal primary voltage at the nominal frequency; and
    the magnetic return path being provided by the laminated iron resting against the tooth tops of the first named iron structure, separated therefrom only by a thin insulating layer.

9. A static magnetic frequency multiplier comprising:
    laminated iron structures forming a closed magnetic circuit;
    a polyphase primary winding, distributed in slots in one of the structures and having a number of pole pairs $p_1$, the winding being such that a voltage will be induced at its terminals substantially only by the fundamental of a field having the pole pair $p_1$;

a secondary winding distributed in slots in one of the structures and magnetically coupled to the primary winding, the secondary winding having a number of pole pairs $p_2$, where $p_2$ is an uneven multiple of $p_1$, the secondary winding being such that no voltage can be induced at its terminals by the fundamental of a field having the pole pair number $p_1$;

the iron structures having at least one magnetic return path at least a portion of which is subjected to pronounced magnetic saturation by the magnetic field produced by the primary winding when it is supplied with the nominal primary voltage at the nominal frequency; and non-magnetic attenuator elements having high electric conductivity; disposed adjacent to the magnetically saturated parts of the laminated iron structures for preventing escape of saturated flux, the attenuator elements being inserts disposed in the slots and insulated from the teeth.

10. A static magnetic frequency multiplier comprising:

laminated iron structures forming a closed magnetic circuit, the laminated iron structures being cylindrical and hollow cylindrical, respectively, and fitted inside one another, one of the iron structures being slotted and the second iron structure being unslotted;

a polyphase primary winding distributed in the slots of the slotted iron structure and having a number of pole pairs $p_1$, the winding being such that a voltage will be induced at its terminals substantially only by the fundamental of a field having the pole pair $p_1$;

a secondary winding distributed in the same slots as the primary winding and magnetically coupled thereto, the secondary winding having a number of pole pairs $p_2$, where $p_2$ is an uneven multiple of $p_1$, the secondary winding being such that no voltage can be induced at its terminals by the fundamental of a field having the pole pair number $p_1$;

the second, unslotted iron structure having a magnetic return path, at least a portion of which is subjected to pronounced magnetic saturation by the magnetic field produced by the primary winding when it is supplied with the nominal primary voltage at the nominal frequency; and a thin layer of insulating material separating the tooth tops on the slotted iron structure from the unslotted iron structure.

* * * * *